US006806489B2

(12) United States Patent
Kang et al.

(10) Patent No.: US 6,806,489 B2

(45) Date of Patent: Oct. 19, 2004

(54) FIELD EMISSION DISPLAY HAVING IMPROVED CAPABILITY OF CONVERGING ELECTRON BEAMS

(75) Inventors: Jung-Ho Kang, Seoul (KR); Yong-Soo Choi, Seoul (KR); Sang-Hyuck Ahn, Seoul (KR); Ho-Su Han, Suwon (KR)

(73) Assignee: Samsung SDI Co., Ltd., Suwon (KR)

( * ) Notice: Subject to any disclaimer, the term of this patent is extended or adjusted under 35 U.S.C. 154(b) by 25 days.

(21) Appl. No.: 10/247,371

(22) Filed: Sep. 20, 2002

(65) Prior Publication Data

US 2003/0071257 A1 Apr. 17, 2003

(30) Foreign Application Priority Data

Oct. 12, 2001 (KR) ........................................ 2001-63069
Mar. 27, 2002 (KR) ........................................ 2002-16806

(51) Int. Cl.$^{7}$ ............................. H01L 49/02; H01J 1/30

(52) U.S. Cl. ............................ 257/11; 257/10; 313/306

(58) Field of Search ....................... 257/10, 11; 313/306

(56) References Cited

U.S. PATENT DOCUMENTS 6,445,114 B1 * 9/2002 Kurokawa et al. .......... 313/310
2001/0006232 A1 7/2001 Choi et al.

* cited by examiner

*Primary Examiner*—Jerome Jackson
(74) *Attorney, Agent, or Firm*—McGuireWoods, LLP

(57) ABSTRACT

A field emission display that is simple to manufacture in a large screen size and that provides improved display characteristics, includes first and second substrates provided opposing one another with a predetermined gap therebetween; a plurality of gate electrodes formed on a surface of the first substrate opposing the second substrate, the gate electrodes being formed in a striped pattern; an insulation layer formed on the first substrate covering the gate electrodes; a plurality of cathode electrodes formed on the insulation layer in a striped pattern to perpendicularly intersect the gate electrodes; a plurality of surface electron sources formed along one long edge of the cathode electrodes; focusing units provided on the cathode electrodes for controlling the emission of electron beams from the surface electron sources; an anode electrode formed on a surface of the second substrate opposing the first substrate; and a plurality of phosphor layers formed on the anode electrode.

20 Claims, 7 Drawing Sheets

FIELD EMISSION DISPLAY HAVING IMPROVED CAPABILITY OF CONVERGING ELECTRON BEAMS

BACKGROUND OF THE INVENTION

1. Field of the Invention

The present invention relates to a field emission display, and more particularly, to a field emission display having a surface electron source made of a carbon-based material and an electron structure to improve the convergence of electron beams emitted from the surface electron source.

2. Description of the Related Art

The first field emission displays (FEDs) used Spindt-type emitters as the source for emitting electrons, in which a low work function metal such as molybdenum, tungsten, and polysilicon is used to form microtips on cathode electrodes. However, Spindt-type emitters are made using conventional semiconductor manufacturing processes that require the use of expensive vacuum equipment. As a result, the overall cost to manufacture the semiconductor is increased and the production of display devices of a large screen size is difficult.

There has been disclosed a surface electron source structure realized by providing a carbon-based material such as carbon nanotubes, graphite, and diamond-like carbon (DLC) as a film covering the cathode electrodes. Since such a surface electron source may be produced by a thick-layer process such as screen printing, the cost of manufacturing the display element is reduced and the manufacture of large screen sizes is simplified.

However, when using the thick-layer process, it is difficult to form the surface electron source within holes of an insulation layer provided to expose the cathode electrodes, and it is difficult to realize a conventional triode structure on the insulation layer. This is because the cathode electrodes and the gate electrodes are easily shorted by the conducting material forming the surface electron source when the surface electron source is printed in holes of the gate electrodes and of the insulation layer.

Therefore, there has been disclosed a structure for an FED, in which gate electrodes for controlling the emission of electrons are arranged on a substrate below cathode electrodes, and an insulation layer is provided between the gate electrodes and the cathode electrodes. U.S. Patent Application Publication No. US2001/0006232 A1 discloses a triode FED of this structure. In such an FED, the structure is simple to thereby make the manufacturing process easy, and the problem of a short occurring between the cathode electrodes and the gate electrodes is eliminated.

However, with this type of FED, except for the anode electrodes for applying a high voltage to accelerate electrons, there are no electrodes involved in the converging of the electron beams emitted from the surface electron source. Accordingly, with reference to FIG. 13, when electron beams are emitted from the surface electron source 22 by the electric field formed in the vicinity of the same, the electron beams are spread out while traveling toward the anode electrodes.

As a result, with reference to FIG. 14, the electron beams emitted from the surface electron source 22 land not only on desired pixels Pa, but also on adjacent pixels Pb and Pc of another color such that these pixels are illuminated. This reduces overall picture quality by degrading resolution, picture precision, etc.

SUMMARY OF THE INVENTION

The present invention has been made in an effort to solve the above problems.

It is an object of the present invention to provide a field emission display that converges electron beams emitted from a surface electron source such that spreading of the electron beams is minimized to selectively illuminate only desired pixels, thereby improving picture quality.

To achieve the above object, in accordance with an embodiment of the present invention, a field emission display is provided including first and second substrates opposing one another with a predetermined gap therebetween; a plurality of gate electrodes formed on a surface of the first substrate opposing the second substrate, the gate electrodes being formed in a striped pattern; an insulation layer formed on the first substrate covering the gate electrodes; a plurality of cathode electrodes formed on the insulation layer in a striped pattern to perpendicularly intersect the gate electrodes; a plurality of surface electron sources formed along one long side of the cathode electrodes; focusing units provided on the cathode electrodes for controlling emission of electron beams from the surface electron sources; an anode electrode formed on a surface of the second substrate opposing the first substrate; and a plurality of phosphor layers formed on the anode electrode.

According to an embodiment of the present invention, the surface electron sources are made from one or mixture of carbon nanotubes, graphite, diamond, DLC, and $C_{60}$ (fullerene).

According to another embodiment of the present invention, the surface electron sources are formed at a predetermined distance and in each of a plurality of pixel regions, which correspond to the intersection of the gate electrodes and cathode electrodes.

According to yet another embodiment of the present invention, the focusing units are converging electrodes that are formed on the cathode electrodes on ends of each of the surface electron sources such that a pair of the converging electrodes is provided for each surface electron source.

According to still yet another embodiment of the present invention, a thickness of the converging electrodes is greater than a thickness of the surface electron sources.

In another embodiment of the present invention, the focusing units are cut portions formed in the cathode electrodes on long sides of the cathode electrodes opposite the long sides on which the surface electron sources are formed, the cut portions decreasing a width of the cathode electrodes.

According to another embodiment of the present invention, the surface electron sources are formed along an entire length of the long sides of the cathode electrodes opposite the long sides in which the cut portions are formed.

According to another embodiment of the present invention, the surface electron sources are formed at predetermined intervals at each pixel region corresponding to areas of intersection between the gate electrodes and the cathode electrodes.

In yet another embodiment of the present invention, the focusing units are extended electrodes, which are extended from a side surface of the cathode electrodes between a bottom surface of the cathode electrodes contacting the insulation layer and an edge portion of the cathode electrodes along which the surface electron sources are formed, the extended electrodes being formed at a predetermined length in a direction perpendicular to a long axis direction of the cathode electrodes and at edges of each pixel region corresponding to areas of intersection between the gate electrodes and the cathode electrodes.

According to another embodiment of the present invention, the length of the extended electrodes is 95% or less a distance between adjacent cathode electrodes.

BRIEF DESCRIPTION OF THE DRAWINGS

The accompanying drawings, which are incorporated in and constitute a part of the specification, illustrate embodiments of the present invention, and, together with the description, serve to explain the principles of the invention.

DETAILED DESCRIPTION OF THE PREFERRED EMBODIMENTS

Preferred embodiments of the present invention will now be described in detail with reference to the accompanying drawings.

Figure 1:
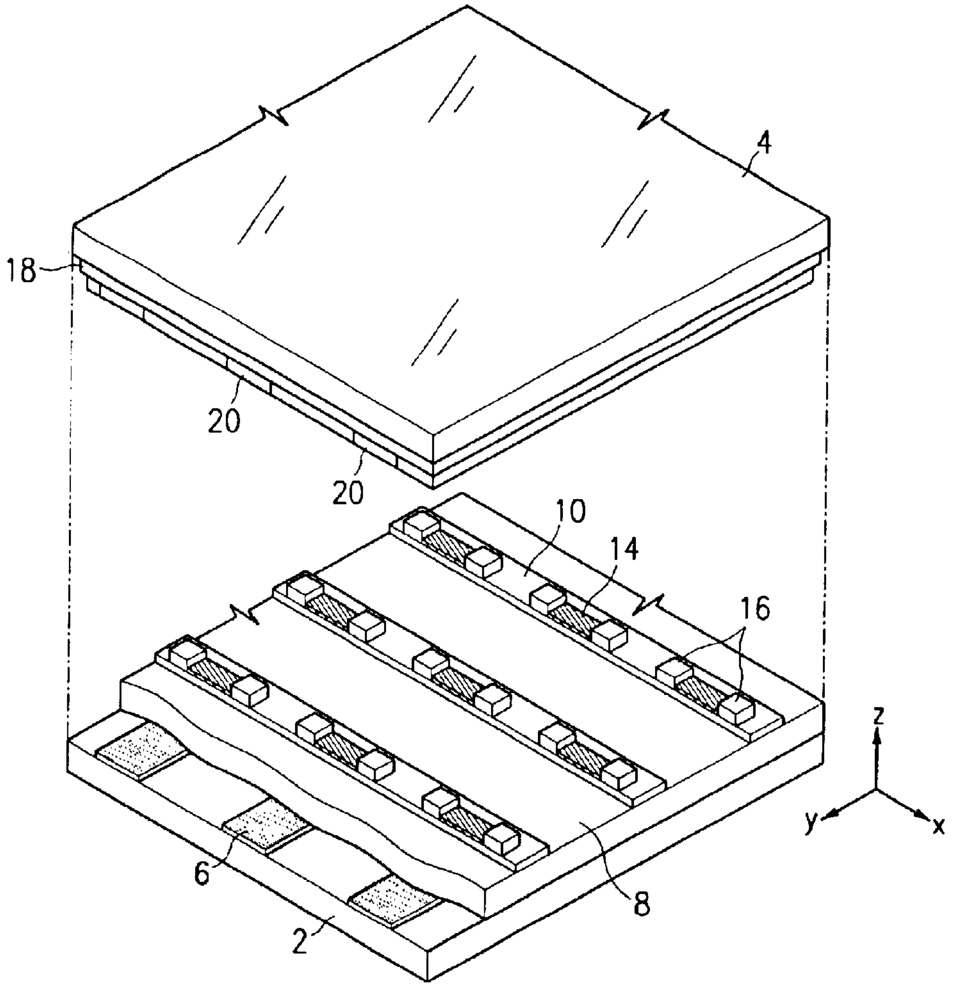
FIG. 1 is a sectional exploded perspective view of a FED according to a first preferred embodiment of the present invention.
Figure 2:
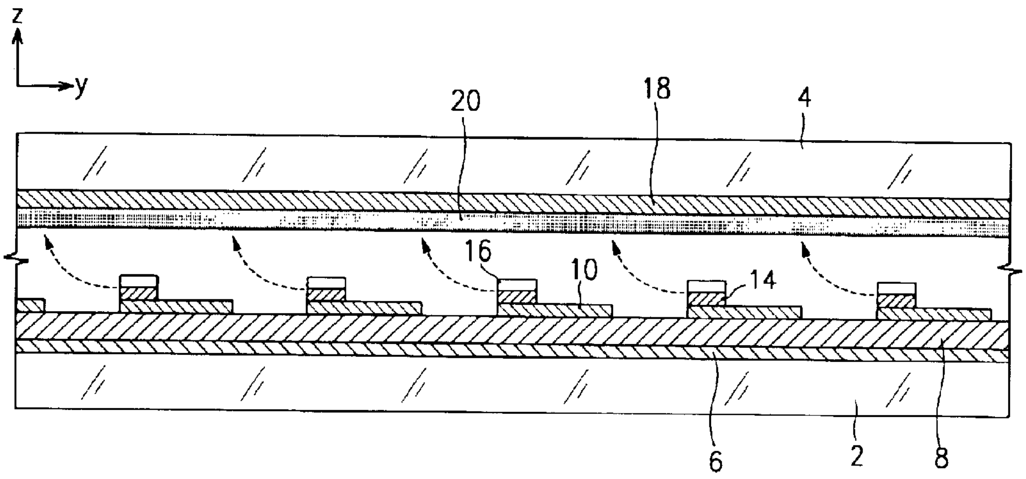
FIG. 2 is a sectional view of the FED of FIG. 1.

FIG. 1 is a sectional exploded perspective view of a FED according to a first preferred embodiment of the present invention, and FIG. 2 is a sectional view of the FED of FIG. 1.

FED according to a first preferred embodiment of the present invention includes a first substrate 2 of predetermined dimensions and a second substrate 4 of predetermined dimensions, the second substrate 4 being provided substantially in parallel to the first substrate 2 and at a predetermined distance therefrom to form a gap between the first and second substrates 2 and 4. The first substrate 2 will hereinafter be referred to as the rear substrate and the second substrate 4 will hereinafter be referred to as the front substrate. A structure for generating an electric field for the emission of electrons is provided on the rear substrate 2 and a structure to enable the realization of predetermined images by the emitted electrons is provided on the front substrate 4. This will be described in more detail below.

A plurality of gate electrodes 6 is formed on the rear substrate 2 in a predetermined pattern. That is, the gate electrodes 6 are formed in a striped pattern with predetermined distances between the individual stripes of the gate electrodes 6. The gate electrodes 6 are provided along direction Y of FIG. 1. Further, an insulation layer 8 is formed over an entire surface of the rear substrate 2 covering the gate electrodes 6. A plurality of cathode electrodes 10 are formed on the insulation layer 8, the cathode electrodes 10 being formed in a striped pattern along direction X of FIG. 1 and at predetermined intervals. Accordingly, the cathode electrodes 10 are perpendicular to the gate electrodes 6. Further, a plurality of surface electron sources 14 are formed on each of the cathode electrodes 10 along one of the two long edge portions thereof (i.e., in the X direction of FIG. 1). Also formed on each of the cathode electrodes 10 is a plurality of converging electrodes 16.

The gate electrodes 6 are manufactured by thick-layer printing a conducting material such as silver paste, or by forming a conductive layer by a thin film process such as sputtering, then patterning the conductive layer using a conventional photolithography process. The cathode electrodes 10 may be produced by performing rear layer printing identically as when manufacturing the gate electrodes 6, or by performing the thin film and patterning processes together with the gate electrodes 6.

Further, the surface electron sources 14 may be made of a carbon-based material, for example, carbon nanotubes, graphite, $C_{60}$ (fullerene), diamond, DLC (diamond-like carbon), or a combination of these materials. The surface electron sources 14 may be manufactured by producing a paste substance from the carbon-based material(s) and then by performing thick-layer printing of the paste on the cathode electrodes 10. Preferably, the surface electron sources 14 are formed at predetermined intervals for each of the pixels, the pixels corresponding to areas where the gate electrodes 6 intersect the cathode electrodes 10. Also, it is preferable that a pair of the converging electrodes 16 is provided on opposite sides of each of the surface electron sources 14 to result in a dot configuration as shown in FIG. 1.

The converging electrodes 16 are formed adjacent to the surface electron sources 14 on opposite ends thereof. The converging electrodes 16 are formed at a predetermined length, width, and height. During operation of the FED, the converging electrodes 16 maintain the same potential as the cathode electrodes 10, and they vary the distribution of the electric field generated in the vicinity of the surface electron sources 14 so as to converge the electron beams emitted therefrom.

Formed on the front substrate 4 are an anode electrode 18 to which a voltage sufficient to accelerate electrons (approximately 1–5 kV) is applied, and a plurality of phosphor layers 20, which are excited by the electron beams to emit visible light.

With the FED structured as described above, if a +70V data signal and a −70V scanning signal are applied respectively to the gate electrodes 6 and to the cathode electrodes 10, an electric field sufficient for the emission of electrons (from the surface electron sources 14) is formed in the vicinity of the surface electron sources 14, which are located where the gate electrodes 6 and the cathode electrodes 10 intersect. As a result, the surface electron sources 14 emit electrons in the form of electron beams, which excite the phosphor layers 20 for illumination of the same (i.e., control the phosphor layers 20 to ON states).

If 0V are applied to one of either the gate electrodes 6 or the cathode electrodes 10, an electrical field sufficient for the emission of electrons from the surface electron sources 14 is not formed in the areas where the surface electron sources 14 are provided. The phosphor layers 20 are controlled to OFF states as a result. With such a drive method, ON/OFF control of all the pixels is possible.

Figure 3:
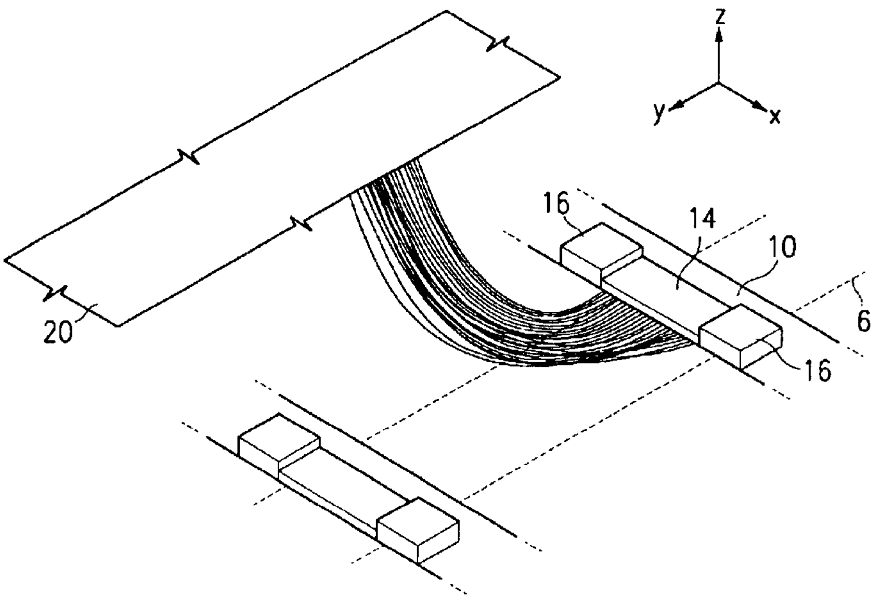
FIG. 3 is a schematic view showing a trace of electron beams emitted from a surface electron source according to a first preferred embodiment of the present invention.

FIG. 3 is a schematic view showing a trace of the electron beams emitted from one of the surface electron sources 14 toward one of the phosphor layers 20. The electron beams are emitted in a concentrated form from one of the edges of the surface electron source 14, and they travel toward a specific phosphor layer 20 drawing out a trace in the form of an arc. Accordingly, it is preferable that the phosphor layers 20, with reference to FIG. 2, are formed along direction Y and at predetermined intervals corresponding to the placement of the surface electron sources 14.

Figure 4:
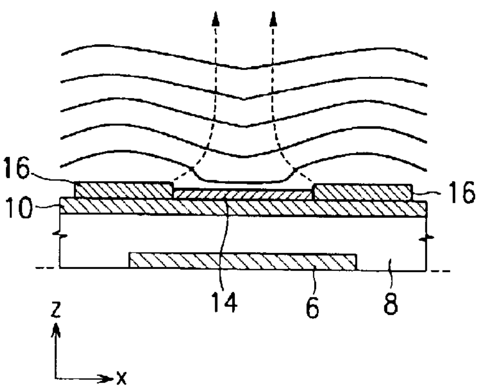
FIG. 4 is a schematic view used to describe the distribution of an electric field in the vicinity of a surface electron source according to a first preferred embodiment of the present invention.
Figure 5:
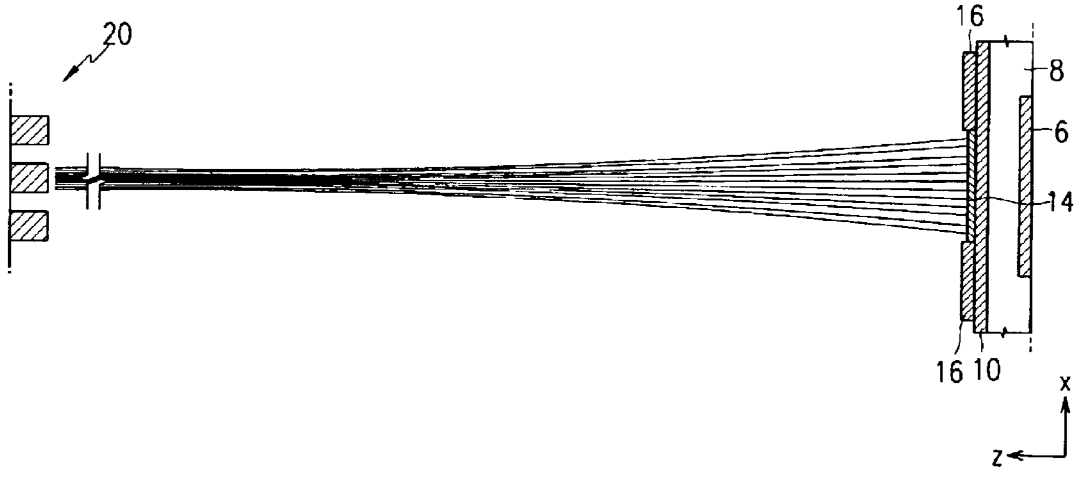
FIG. 5 is a schematic view, which is taken seen looking toward the x-z plane, showing the convergence of electron beams emitted from a surface electron source on a pixel according to a first preferred embodiment of the present invention.

The electrons emitted from the surface electron sources 14 are focused by the converging electrodes 16 provided to both sides of each of the surface electron sources 14, that is, the converging electrodes 16 provide a force to converge the electrons toward the correct phosphor layer 20. FIG. 4 shows the distribution of an electric field in the vicinity of the surface electron sources 14, and FIG. 5, which is taken seen looking toward the x-z plane, shows the convergence of electron beams emitted from one of the surface electron sources 14. At one of the surface electron sources 14, equipotential lines formed in the vicinity of the surface electron source 14 are curved upward (i.e., in the direction the electron beams travel) by the pair of converging electrodes 16.

That is, the equipotential lines formed in the vicinity of the surface electrode 14 are upwardly curved by the converging electrodes 16 such that the electron beams emitted from the surface electron source 14 are converged by the deformed equipotential lines. As a result, a lens effect is realized. The electron beams are accelerated by the anode voltage, and in the process of traveling toward the corresponding phosphor layer 20 they are focused such that the degree of convergence of the electron beams is improved.

Therefore, the electron beams emitted from the surface electron source 14 are converged onto only the intended phosphor layer 20 and do not land on phosphor layers 20 of different colors such that precise phosphor layer illumination is realized. Although not shown in FIG. 5, it should be evident that the converging electrodes 16 also act to converge the electron beams emitted from the surface electron sources 14 in direction Y to thereby better control the electron beams to land only on the intended phosphor layer 20 and therefore to not spread out onto other phosphor layers 20.

Figure 6:
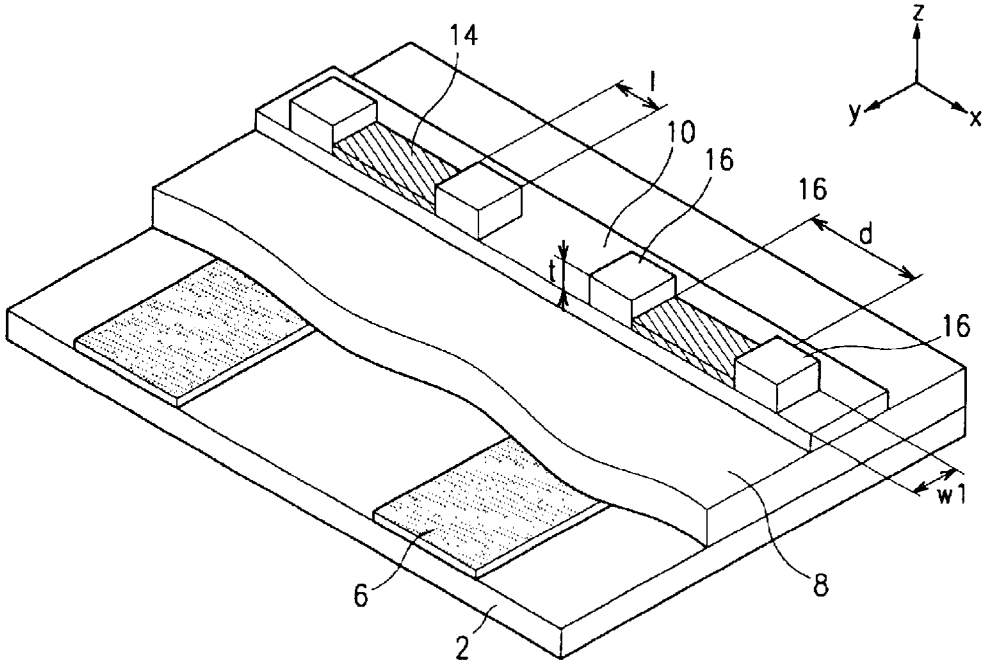
FIG. 6 is a partially cutaway perspective view of the FED of FIG. 1 used for describing converging electrodes.

The focusing operation of the converging electrodes 16, with reference to FIG. 6, may be controlled by the following parameters: a thickness (t) of the converging electrodes 16; a length (l) of the converging electrodes 16 along direction X; a width (w1) of the converging electrodes 16 along direction Y; and a distance (d) between each pair of converging electrodes 16 in direction X, with a pair of the converging electrodes 16 being provided on opposite sides of each of the surface electron sources 14 as described above. By varying these parameters, the converging capability of the converging electrodes 16 with respect to the electron beams may be optimized.

Figure 7:
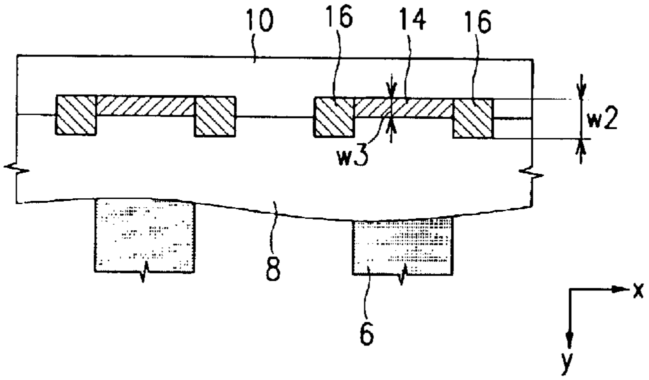
FIG. 7 is a partially cutaway plane view of the FED of FIG. 1 used for describing converging electrodes.

As an example, the thickness (t) of the converging electrodes 16 may be made greater than a thickness of the surface electron sources 14 to increase the lens effect realized by the converging electrodes 16, and the width (w1) of the converging electrodes 16 may be made identical to a width of the surface electron sources 14. In another example, with reference to FIG. 7, the converging electrodes 16 may extend past the long edge of the cathode electrodes 10 on which the converging electrodes 16 are formed to be positioned partly over the insulating layer 8 such that a width (w2) of the converging electrodes 16 in direction Y is greater than a width (w3) of the surface electron sources 14 in direction Y.

The converging electrodes 16 may be produced using a conventional thick-layer printing process, a conventional plating process in which a plating catalyst is used, or by printing a conducting paste containing photosensitive material on the rear substrate 2 then performing exposure and development processes to obtain a desired shape in a specific pattern.

Figure 8:
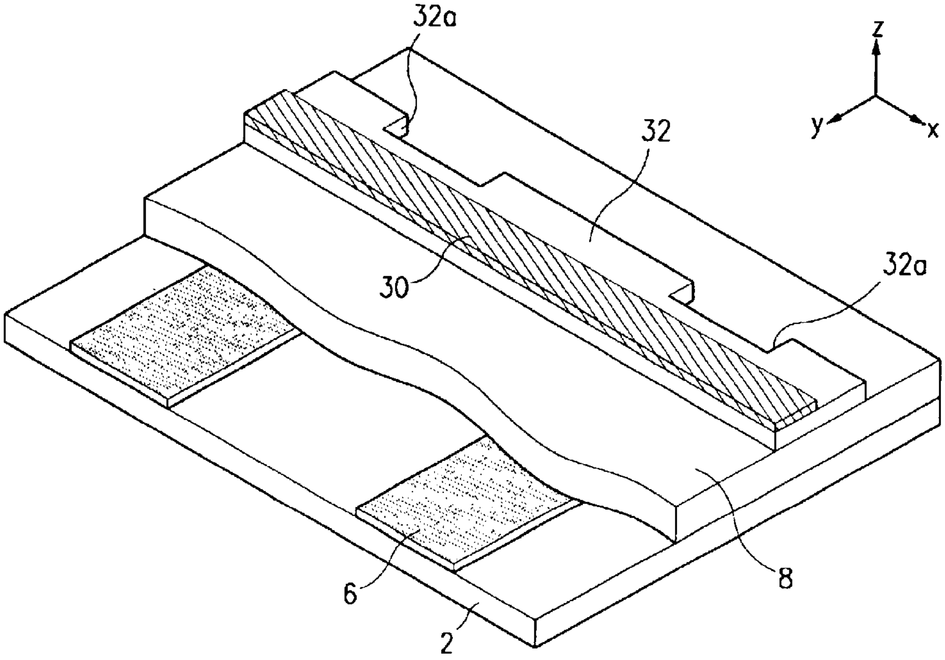
FIG. 8 is a partially cutaway perspective view of a FED according to a second preferred embodiment of the present invention.

FIG. 8 is a partially cutaway perspective view of a FED according to a second preferred embodiment of the present invention. As shown in the drawing, a surface electron source 30 is formed along an entire length of a cathode electrode 32 on a long edge portion thereof (i.e., in the X direction). A plurality of cut portions **32*a* are formed in the cathode electrode 32** for maintaining good focusing characteristics of the electron beams and also to increase the strength of an electric field in pixel regions.

The cut portions **32*a* are formed on a side of the cathode electrode 32 opposite the side on which the surface electron source 30 is formed, and at points of intersection of gate electrodes 6 and the cathode electrode 32. Accordingly, the cut portions 32*a* reduce a width of the cathode electrode 32 at areas intersecting the gate electrodes 6. The cut portions 32*a* are formed by removing corresponding areas of the cathode electrode 32 after the cathode electrode 32 is formed, or by providing the cathode electrode 32 in a formation with the cut portions 32*a*** included.

If it is assumed that the above formation of the cathode electrode 32 and surface electron source 30 is repeated for all cathode electrodes 32 and surface electron sources 30 on a rear substrate 2, the cut portions 32 in all areas of intersection between the gate electrodes 6 and the cathode electrodes 32 act to accumulate an electric field at center portions of each pixel so as to increase the strength of the electric fields. Accordingly, electron beams emitted from the pixels are converged toward corresponding phosphor layers (not shown).

In addition to the striped pattern of the surface electron source 30 as described above, the surface electron source 30 may also be formed in a dot pattern, in which the surface electron source 30 is realized through a plurality of sections of a predetermined size and shape and is formed at predetermined intervals at each pixel corresponding to the intersection of the gate electrodes 6 and the cathode electrodes 32.

Figure 9:
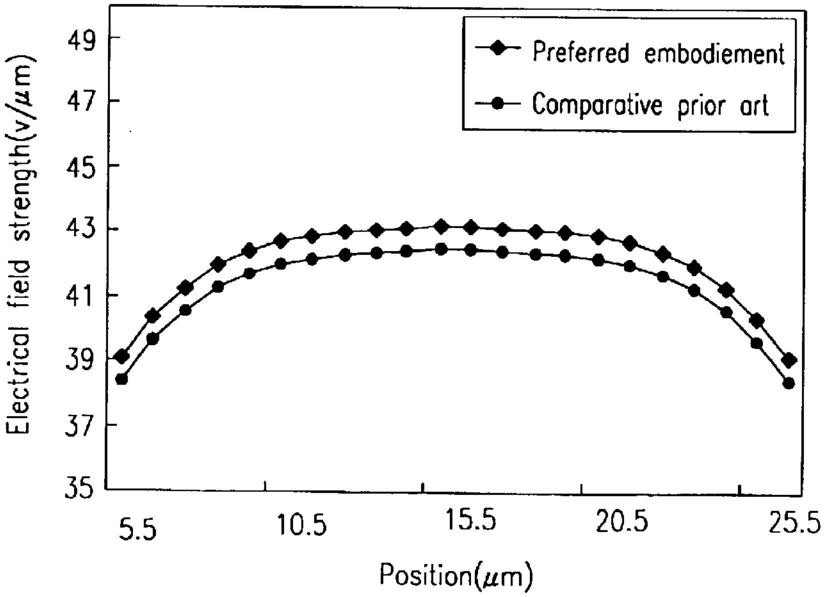
FIG. 9 is a graph comparing strengths of electric fields of a FED according to a second preferred embodiment of the present invention and of a conventional FED.

FIG. 9 is a graph comparing strength of electric fields in the vicinity of a surface electron source corresponding to a single pixel region in a FED according to the second preferred embodiment of the present invention in which the cut portions 32*a* are formed in the cathode electrodes 32, and in a conventional field emission display that does not include cut portions in the cathode electrodes. The graph is made with a +70V data voltage and a −70V scanning voltage being applied to the gate electrodes and to the cathode electrodes, respectively.

As shown in the graph of FIG. 9, the strength of the electric field is greater over the entire area of the pixel region for the second preferred embodiment of the present invention than it is for the conventional FED. This is particularly true for the center area of the pixel where most of the electron emission takes place.

Figure 10:
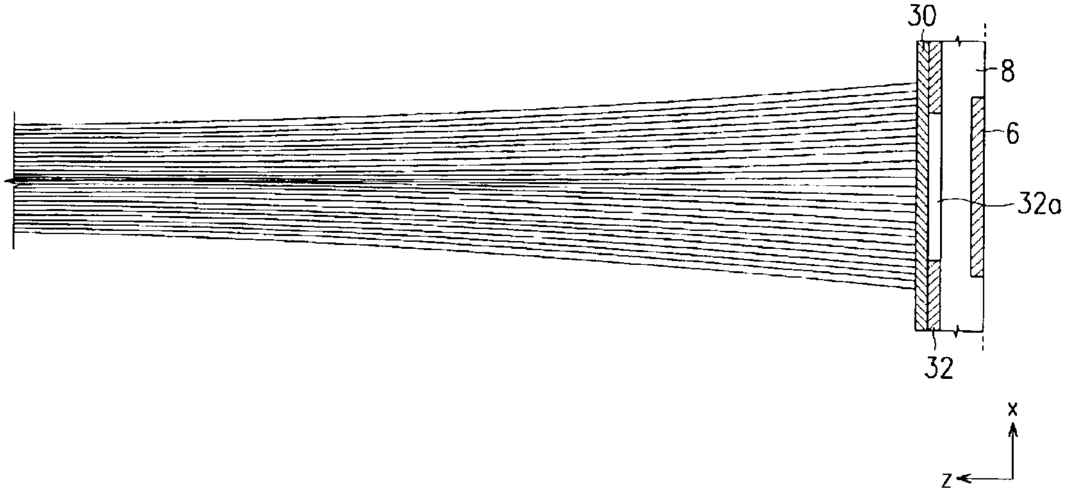
FIG. 10 is a schematic view, which is taken seen looking toward the x-z plane, showing the convergence of electron beams emitted from a surface electron source on a pixel according to a second preferred embodiment of the present invention.

FIG. 10 is a schematic view, which is taken seen looking toward the x-z plane, showing the convergence of electron beams emitted from one of the surface electron sources 30. The electron beams emitted from the surface electron source 30 are converged toward a corresponding phosphor layer (not shown) while traveling in direction Z by an anode voltage.

By varying the parameters of the cut portions 32*a* such as length and width, the degree of convergence of the electron beams and the strength of the electric field in each pixel region may be optimized. The cut portions 32*a* may be formed in various shapes in addition to the shape shown in FIG. 8. For example, the cut portions 32*a* may be triangular, elliptical, etc.

Further, as a means to converge the electron beams emitted from the surface source electrons 14, both the cut portions 32*a* and converging electrodes 16 may be provided on the cathode electrodes 32 in all pixel regions. Since the effect of this configuration is identical to the first and second preferred embodiments, a detailed description will not be provided.

Figure 11:
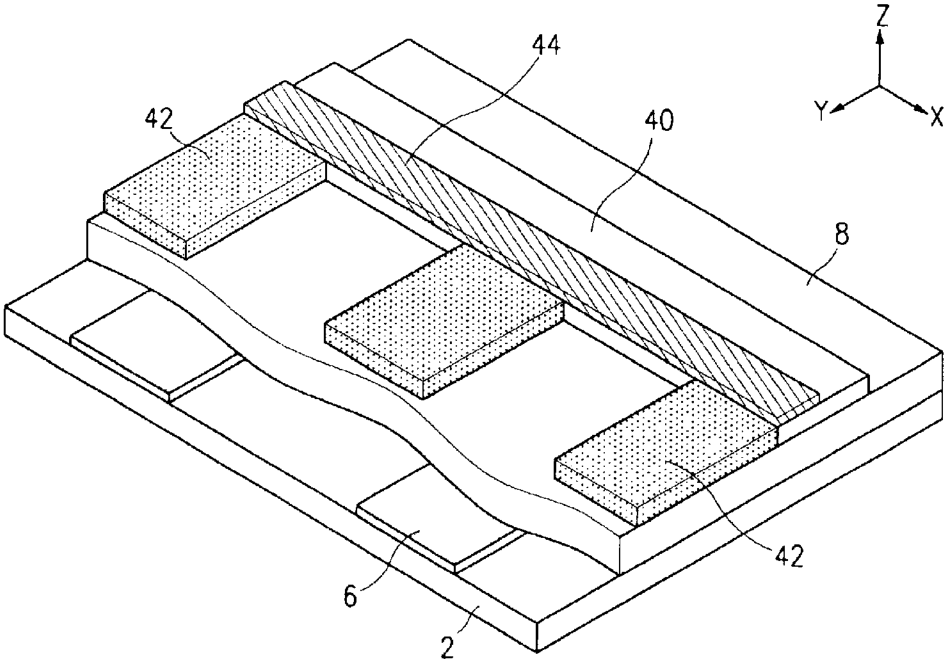
FIG. 11 is a partially cutaway perspective view of a FED according to a third preferred embodiment of the present invention.

FIG. 11 is a partially cutaway perspective view of a FED according to a third preferred embodiment of the present invention. In the third preferred embodiment of the present invention, as a means to improve focusing characteristics of an electron beam, a plurality of extended electrodes 42 are formed on one side of a cathode electrode 40. The extended electrodes 42 are formed at a predetermined length in direction Y, which is perpendicular to a long direction of the cathode electrode 40 (i.e., the X direction), and at predetermined intervals.

In more detail, a surface electron source 44 is formed along an entire length of a cathode electrode 40 on a long edge portion thereof, and the extended electrodes 42 are extended from a side surface of the cathode electrode 40 between a bottom surface of the cathode electrode 40 contacting an insulation layer 8 and the edge portion of the cathode electrode 40 along which the surface electron source 44 is formed. The extended electrodes 42 are provided at a predetermined length along edges of each pixel, and are made of a conducting material, for example, a conducting material identical to that of the cathode electrodes 40 to maintain an equal potential with the cathode electrodes 40 when the FED is operated.

With the above structure, an electric field is concentrated toward a center of each pixel during operation of the FED such that the diffusing of electron beams is minimized. As a result, the configuration of the third preferred embodiment of the operation acts to converge electron beams toward a corresponding phosphor layer.

That is, the extended electrodes 42, as with the converging electrodes 16 of the first preferred embodiment of the present invention, strengthen the electric field generated by the cathode electrode 40 toward centers of pixels on both sides of regions of the surface electron source 44 corresponding to each pixel. As a result, the emission of the electron beams in direction X of the drawing is prevented and the electron beams are converged.

Further, since the extended electrodes 42 maintain the same potential as the cathode electrode 40 at edges of each pixel region, the extended electrodes 42 prevent, by a cathode potential applied to the extended electrodes 44, the electric field at peripheries of the surface electron source 44 from being affected by a drive voltage applied to an adjacent gate electrode. As a result, electric field interference from the drive voltage of an adjacent gate electrode is prevented.

Figure 12:
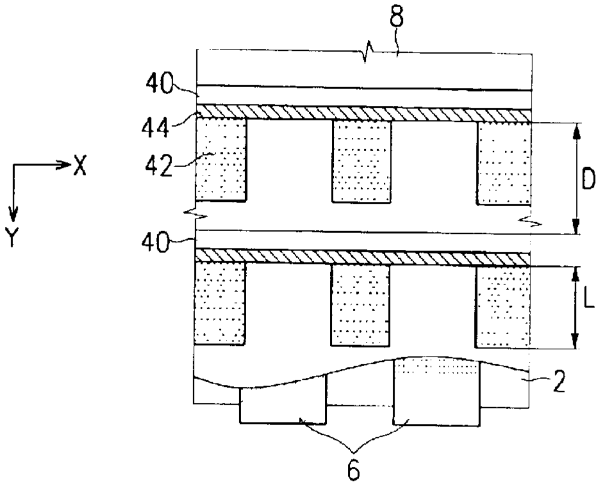
FIG. 12 is a partial plane view of a FED according to a third preferred embodiment of the present invention.
Figure 13:
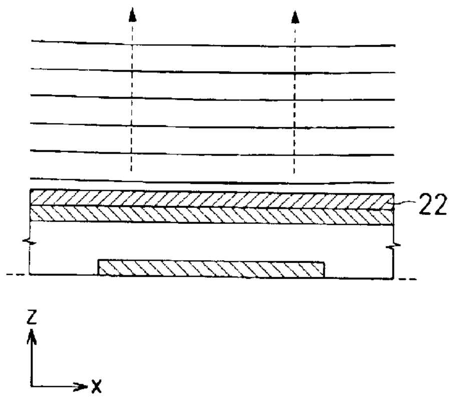
FIG. 13(Prior Art)
FIG. 13 is a schematic view used to describe the distribution of an electric field in the vicinity of a surface electron source in a conventional FED.
Figure 14:
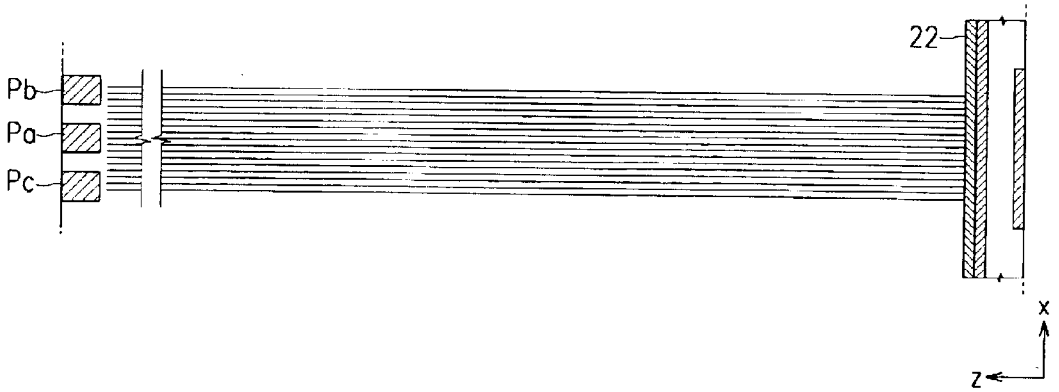
FIG. 14(Prior Art)
FIG. 14 is a schematic view showing the trace of electron beams emitted from a surface electron source in a conventional FED.

With reference to FIG. 12, it is preferable that a length L of the extended electrodes 42 is less than or equal to 95% of a distance D between two adjacent cathode electrodes 40 along direction Y. This prevents the conduction of electricity between the extended electrodes 42 and an adjacent cathode electrodes 40.

In addition, although the surface electron source 44 of the third preferred embodiment of the present invention is described and shown in a striped pattern, it is also possible to form the surface electron source in a dot pattern as with the above embodiments.

In the FED of the present invention structured and operating as in the above, the converging of the electron beams emitted from the surface electron sources is improved with the use of converging electrodes and/or cut portions in the cathode electrodes. As a result, only the intended pixels are illuminated such that precise display is realized, and overall display quality (e.g., resolution) is improved.

Also, the converging electrodes and cut portions are easily manufactured to thereby help simplify the manufacture of the FED and to allow for the manufacture of large screen sizes.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A field emission display comprising:

first and second substrates provided opposing one another with a predetermined gap therebetween;

a plurality of gate electrodes formed on a surface of the first substrate opposing the second substrate, the gate electrodes being formed in a striped pattern;

an insulation layer formed on the first substrate covering the gate electrodes;

a plurality of cathode electrodes formed on the insulation layer in a striped pattern to perpendicularly intersect the gate electrodes;

a plurality of surface electron sources formed along one long side of the cathode electrodes;

focusing units provided on the cathode electrodes for controlling emission of electron beams from the surface electron sources;

an anode electrode formed on a surface of the second substrate opposing the first substrate; and a plurality of phosphor layers formed on the anode electrode.

2. The field emission display of claim 1, wherein the surface electron sources are made from one or a mixture of carbon nanotubes, graphite, diamond, diamond-like carbon, and $C_{60}$(fullerene).

3. The field emission display of claim 1, wherein the surface electron sources are formed at a predetermined distance and in each of a plurality of pixel regions that correspond to the intersection of the gate electrodes and cathode electrodes.

4. The field emission display of claim 3, wherein the focusing units are converging electrodes that are formed on the cathode electrodes on ends of each of the surface electron sources such that a pair of the converging electrodes is provided for each surface electron source.

5. The field emission display of claim 4, wherein a thickness of the converging electrodes is greater than a thickness of the surface electron sources.

6. The field emission display of claim 5, wherein a width of the converging electrodes in a direction perpendicular to a long side direction is equal to a width of the surface electron sources.

7. The field emission display of claim 4, wherein the converging electrodes are formed such that the converging electrodes are extended past the long edge of the cathode electrodes and are positioned partly over the insulating layer such that a width of the converging electrodes is greater than a width of the surface electron sources in a direction perpendicular to a long side direction of the cathode electrodes.

8. The field emission display of claim 1, wherein the focusing units are cut portions formed in the cathode electrodes on long sides of the cathode electrodes opposite the long sides on which the surface electron sources are formed, the cut portions decreasing a width of the cathode electrodes.

9. The field emission display of claim 8, wherein the cut portions are formed in a shape of a rectangle, a triangle or an ellipse.

10. The field emission display of claim 8, wherein the surface electron sources are formed along an entire length of the long sides of the cathode electrodes opposite the long sides in which the cut portions are formed.

11. The field emission display of claim 8, wherein the surface electron sources are formed at predetermined intervals at each pixel region corresponding to areas of intersection between the gate electrodes and the cathode electrodes.

12. The field emission display of claim 1, wherein the focusing units are extended electrodes, which are extended from a side surface of the cathode electrodes between a bottom surface of the cathode electrodes contacting the insulation layer and an edge portion of the cathode electrodes along which the surface electron sources are formed, the extended electrodes being formed at a predetermined length in a direction perpendicular to a long side direction of the cathode electrodes and at edges of each pixel region corresponding to areas of intersection between the gate electrodes and the cathode electrodes.

13. The field emission display of claim 12 wherein the length of the extended electrodes in a direction perpendicular to the long side direction of the cathode electrodes is less than or equal to 95% of a distance between two adjacent cathode electrodes.

14. The field emission display of claim 12, wherein the length of the extended electrodes is greater than 95% but less than 100% of a distance between two adjacent cathode electrodes.

15. The field emission display of claim 1, wherein the emitted electron beams travel toward a portion of a phosphor layer which is not overlapping the surface electron surfaces from which electron beams are being emitted.

16. The field emission display of claim 1, wherein the emitted electron beams are emitted from at least a portion of a side of the surface electron source which is substantially perpendicular to a direction formed by the long side of the cathode electrode.

17. A field emission display comprising:

a first substrate and a second substrate provided opposing one another with a predetermined gap therebetween;

a plurality of gate electrodes formed on a surface of the first substrate opposing the second substrate, the gate electrodes being formed in a striped pattern;

an insulation layer formed on the first substrate covering the gate electrodes;

a plurality of cathode electrodes formed on the insulation layer in a striped pattern to perpendicularly intersect the gate electrodes;

a plurality of surface electron sources formed along one long side of the cathode electrodes;

focusing units provided on the cathode electrodes for controlling emission of electron beams from the surface electron sources;

an anode electrode formed on a surface of the second substrate opposing the first substrate; and a plurality of phosphor layers formed on the anode electrode, wherein the focusing units are extended electrodes, which are extended from a side surface of the cathode electrodes between a bottom surface of the cathode electrodes contacting the insulation layer and an edge portion of the cathode electrodes along which the surface electron sources are formed, the extended electrodes being formed at a predetermined length in a direction perpendicular to a long side direction of the cathode electrodes and at edges of each pixel region corresponding to areas of intersection between the gate electrodes and the cathode electrodes, and wherein the length of the extended electrodes in a direction perpendicular to the long side direction of the cathode electrodes is less than or equal to 95% of a distance between two adjacent cathode electrodes.

18. The field emission display of claim 17, wherein the emitted electron beams travel toward a portion of a phosphor layer which is not overlapping the surface electron surfaces from which electron beams are being emitted.

19. The field emission display of claim 17, wherein the emitted electron beams are emitted from at least a portion of a side of the surface electron source which is substantially perpendicular to a direction formed by the long side of the cathode electrode.

20. A field emission display comprising:

a first substrate and a second substrate provided opposing one another with a predetermined gap therebetween;

a plurality of gate electrodes formed on a surface of the first substrate opposing the second substrate, the gate electrodes being formed in a striped pattern;

an insulation layer formed on the first substrate covering the gate electrodes;

a plurality of cathode electrodes formed on the insulation layer in a striped pattern to perpendicularly intersect the gate electrodes;

a plurality of surface electron sources formed along one long side of the cathode electrodes;

focusing units provided on the cathode electrodes for controlling emission of electron beams from the surface electron sources;

an anode electrode formed on a surface of the second substrate opposing the first substrate; and a plurality of phosphor layers formed on the anode electrode, wherein the focusing units are extended electrodes, which are extended from a side surface of the cathode electrodes between a bottom surface of the cathode electrodes contacting the insulation layer and an edge portion of the cathode electrodes along which the surface electron sources are formed, the extended electrodes being formed at a predetermined length in a direction perpendicular to a long side direction of the cathode electrodes and at edges of each pixel region corresponding to areas of intersection between the gate electrodes and the cathode electrodes, and wherein the length of the extended electrodes is greater than 95% but less than 100% of a distance between two adjacent cathode electrodes.

* * * * *